United States Patent
Yamanaka et al.

(10) Patent No.: US 10,644,096 B2
(45) Date of Patent: May 5, 2020

(54) DISPLAY DEVICE

(71) Applicant: Sharp Kabushiki Kaisha, Sakai, Osaka (JP)

(72) Inventors: Masaki Yamanaka, Sakai (JP); Yohsuke Kanzaki, Sakai (JP); Takao Saitoh, Sakai (JP); Masahiko Miwa, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/463,003

(22) PCT Filed: Aug. 22, 2017

(86) PCT No.: PCT/JP2017/029960
§ 371 (c)(1),
(2) Date: May 22, 2019

(87) PCT Pub. No.: WO2019/038835
PCT Pub. Date: Feb. 28, 2019

(65) Prior Publication Data
US 2019/0326383 A1  Oct. 24, 2019

(51) Int. Cl.
*H01L 27/32* (2006.01)
*H01L 51/50* (2006.01)
*H01L 51/52* (2006.01)

(52) U.S. Cl.
CPC ...... *H01L 27/3276* (2013.01); *H01L 27/3248* (2013.01); *H01L 27/3258* (2013.01); *H01L 51/5012* (2013.01); *H01L 51/5092* (2013.01); *H01L 51/5203* (2013.01); *H01L 2251/5338* (2013.01)

(58) Field of Classification Search
CPC ............ H01L 27/3276; H01L 27/3248; H01L 27/3258; H01L 51/5012; H01L 51/5092; H01L 51/5203
USPC .......................................................... 257/40
See application file for complete search history.

(56) References Cited

U.S. PATENT DOCUMENTS

| | | | |
|---|---|---|---|
| 9,706,607 B2 * | 7/2017 | Kim | ................. H05B 33/04 |
| 2014/0049449 A1 * | 2/2014 | Park | ................... G09G 5/00 345/1.3 |
| 2014/0138637 A1 | 5/2014 | Yang et al. | |
| 2014/0254111 A1 | 9/2014 | Yamazaki et al. | |
| 2016/0174304 A1 | 6/2016 | Kim et al. | |
| 2017/0155066 A1 * | 6/2017 | Minami | ............. H01L 27/3276 |
| 2017/0170206 A1 | 6/2017 | Lee et al. | |

FOREIGN PATENT DOCUMENTS

| | | |
|---|---|---|
| JP | 2011-237661 A | 11/2011 |
| JP | 2014-197181 A | 10/2014 |
| JP | 2016-503515 A | 2/2016 |
| JP | 2017-111435 A | 6/2017 |

OTHER PUBLICATIONS

Official Communication issued in International Patent Application No. PCT/JP2017/029960, dated Nov. 7, 2017.

* cited by examiner

*Primary Examiner* — Ori Nadav
(74) *Attorney, Agent, or Firm* — Keating & Bennett, LLP

(57) ABSTRACT

The frame wiring line provided in a frame region includes, at a bending section, a plurality of branch wiring lines being divided into a plurality of branches, wherein the plurality of branch wiring lines are arranged at at least two types of heights relative to a resin substrate.

5 Claims, 8 Drawing Sheets

DISPLAY DEVICE

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace the liquid crystal display device. As the organic EL display device, a flexible organic EL display device, in which an organic EL element, a variety of films, or the like is layered on a flexible resin substrate has been proposed. In the organic EL display device, a rectangular display region for displaying an image and a frame region formed around the display region, where reduction of the frame region is demanded, is provided. In the flexible organic EL display device, for example, if the frame region is reduced by bending the frame region located on the terminal side, the wiring line arranged in the frame region may be broken.

For example, PTL 1 discloses a flexible display with a redundancy design including a pair of sinusoidal metal wiring lines being out of phase by approximately 180 degrees from each other.

CITATION LIST

Patent Literature

PTL 1: JP 2016-503515 T

SUMMARY

Technical Problem

Incidentally, as disclosed in PTL 1, wiring lines, which are branched to a plurality of redundant wiring lines at the bending section of the frame region, maintains the function of the wiring lines even if the branch wiring lines are partially broken, while a stress is liable to be uniformly applied to the branch wiring lines when the bending section is caused to be bent, so that the branch wiring lines are uniformly broken, thus, there is room for improvement.

The disclosure has been made in view of the above, and an object of the disclosure is to prevent breakage of branch wiring lines at the bending section of the frame region.

Solution to Problem

In order to achieve the above object, a display device according to the disclosure includes a resin substrate, a light-emitting element configuring a display region provided on the resin substrate, a frame region provided around the display region, a terminal section provided at an end portion of the frame region, a bending section provided between the display region and the terminal section, and a frame wiring line provided in the frame region, the frame wiring line extending to the terminal section with being connected to the light-emitting element, wherein the frame wiring line includes, at the bending section, a plurality of branch wiring lines divided into a plurality of branches, and the plurality of branch wiring lines are arranged at at least two types of heights relative to the resin substrate.

Advantageous Effects of Disclosure

According to the disclosure, the frame wiring line includes, at the bending section, a plurality of branch wiring lines divided into a plurality of branches, wherein the plurality of branch wiring lines are arranged at at least two types of heights relative to the resin substrate, thus making it possible to prevent breakage of the branch wiring lines at the bending section of the frame region.

BRIEF DESCRIPTION OF DRAWINGS

FIG. 13 is a view corresponding to FIG. 11.

DESCRIPTION OF EMBODIMENTS

Embodiments of the disclosure will be described below in detail with reference to the drawings. The disclosure is not limited to the embodiments described below.

First Embodiment

Figure 1:
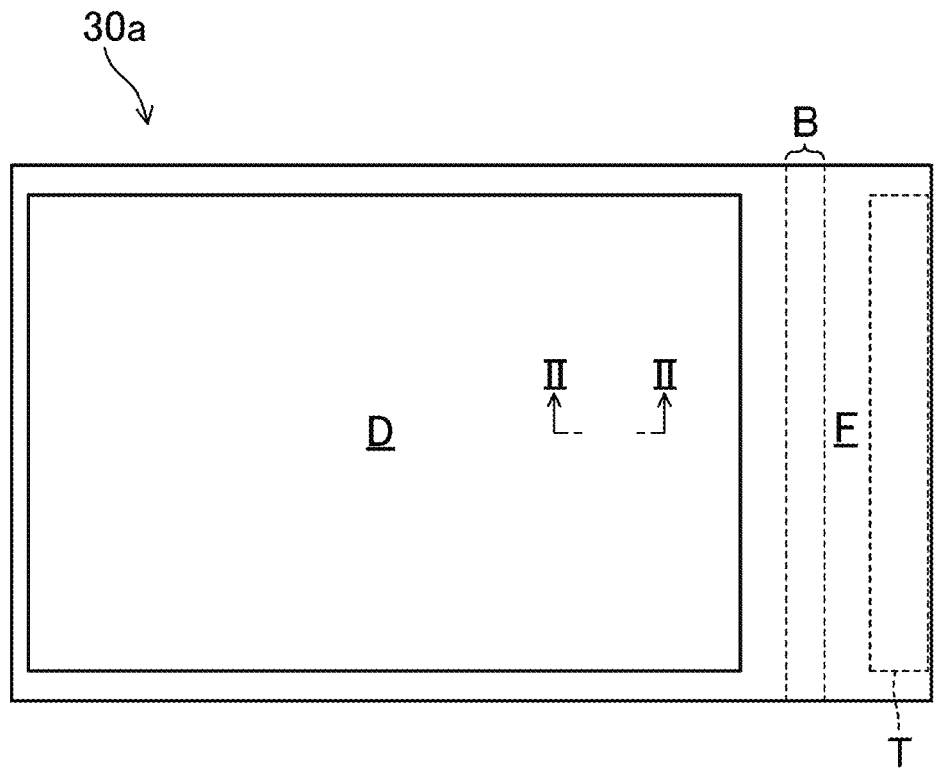
FIG. 1 is a plan view of an organic EL display device according to a first embodiment of the disclosure.
Figure 2:
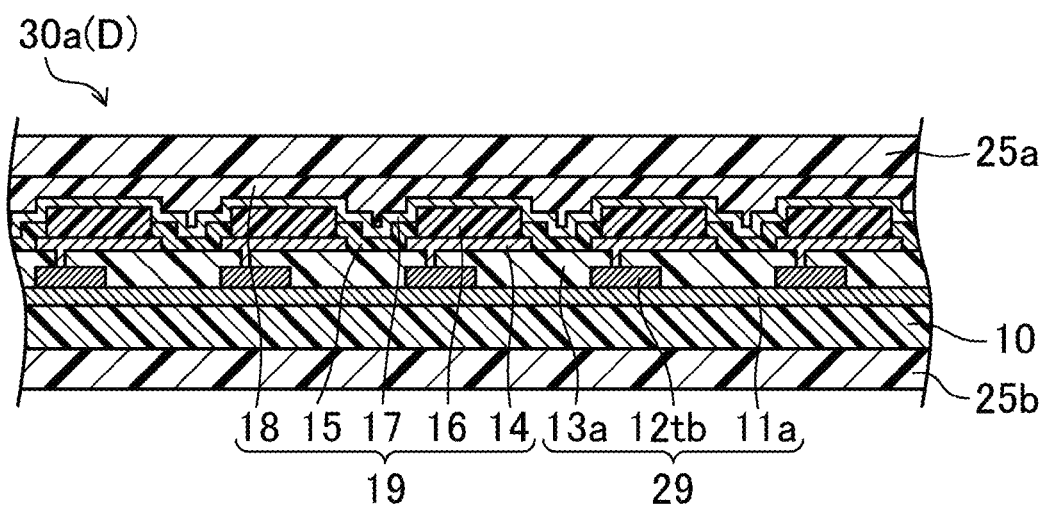
FIG. 2 is a cross-sectional view of a display region of the organic EL display device taken along line II-II in FIG. 1.
Figure 3:
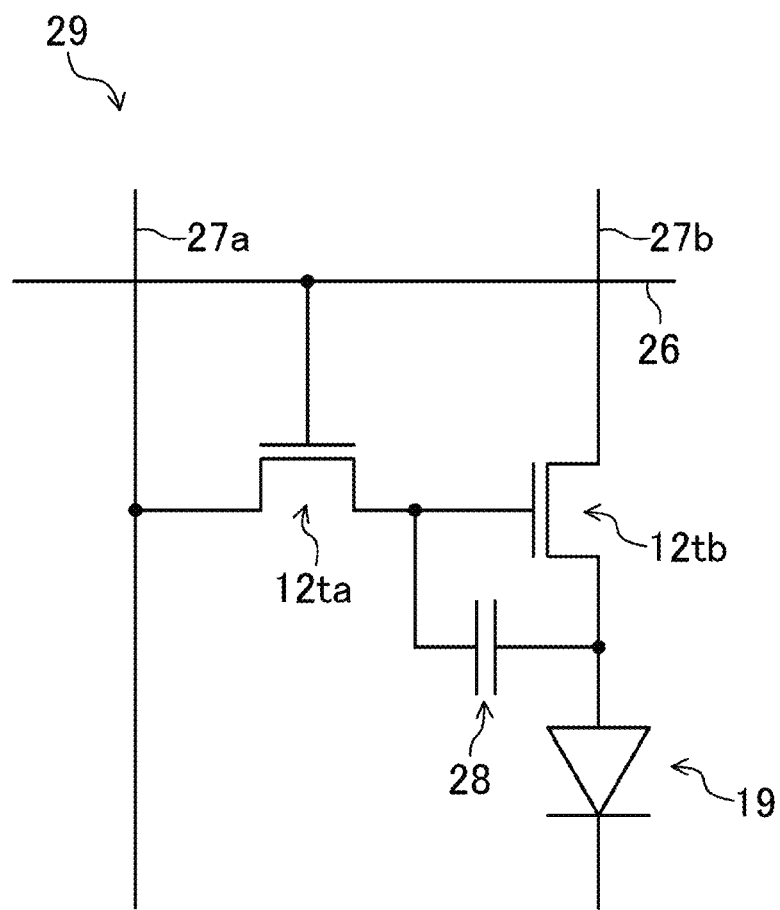
FIG. 3 is an equivalent circuit diagram illustrating a TFT layer included in the organic EL display device according to the first embodiment of the disclosure.
Figure 4:
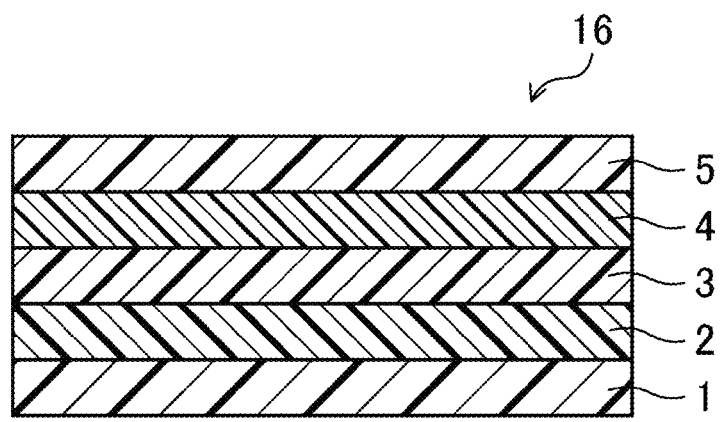
FIG. 4 is a cross-sectional view illustrating an organic EL layer included in the organic EL display device according to the first embodiment of the disclosure.
Figure 5:
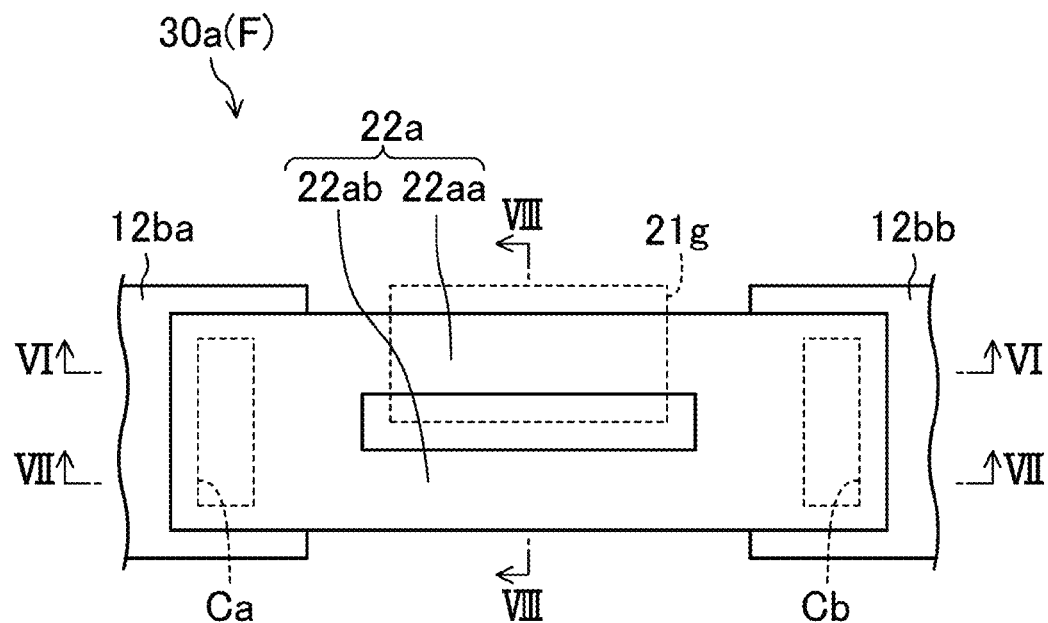
FIG. 5 is a plan view illustrating a frame region of the organic EL display device according to the first embodiment of the disclosure.
Figure 6:
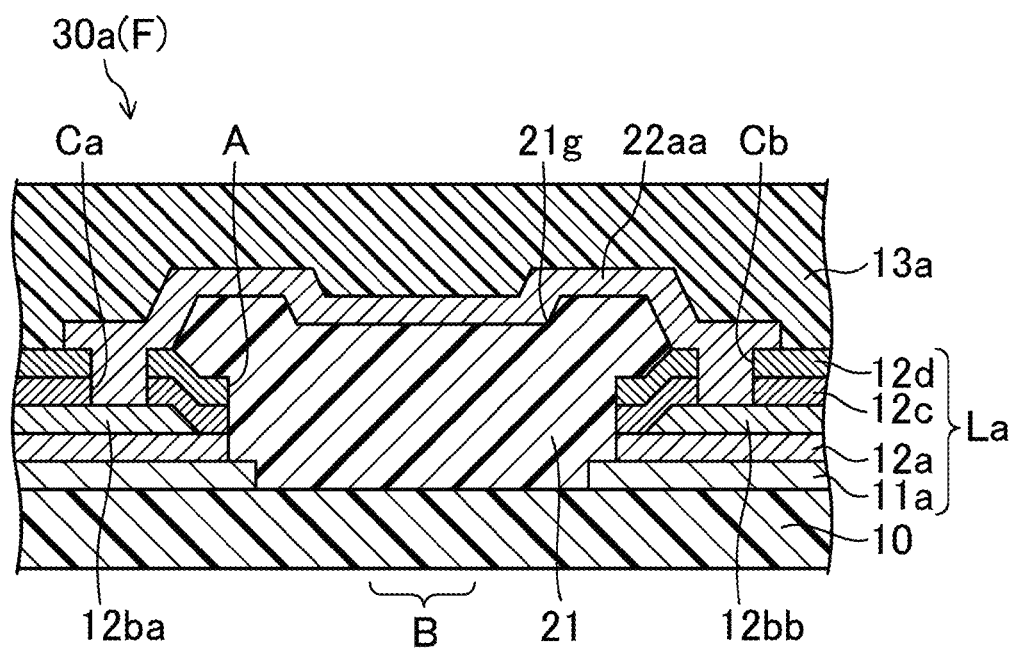
FIG. 6 is a cross-sectional view of a frame region of the organic EL display device taken along the line VI-VI in FIG. 5.
Figure 7:
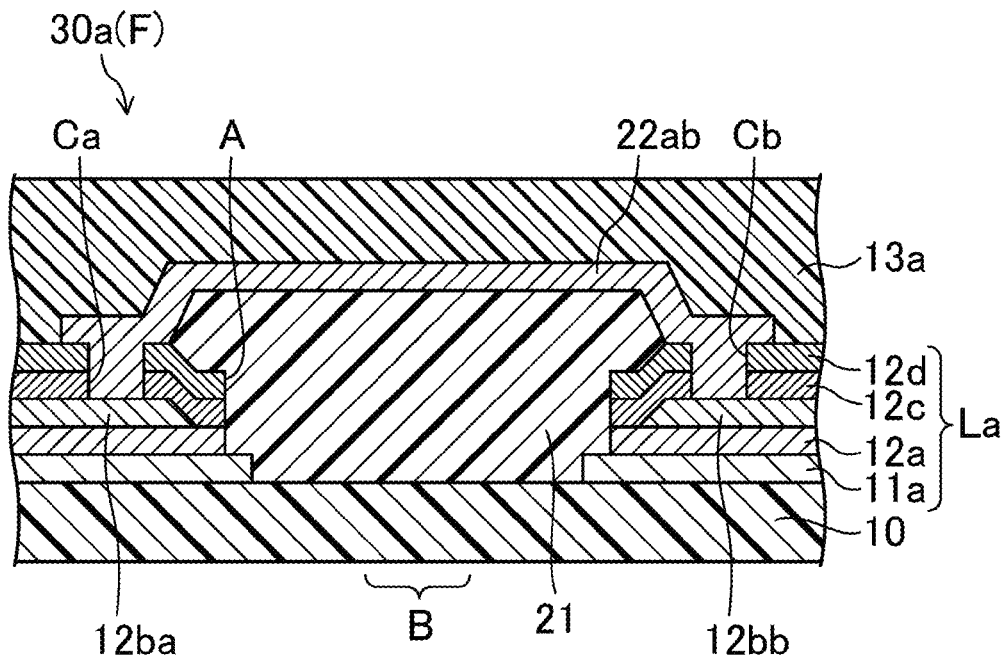
FIG. 7 is a cross-sectional view of a frame region of the organic EL display device taken along the line VII-VII in FIG. 5.
Figure 8:
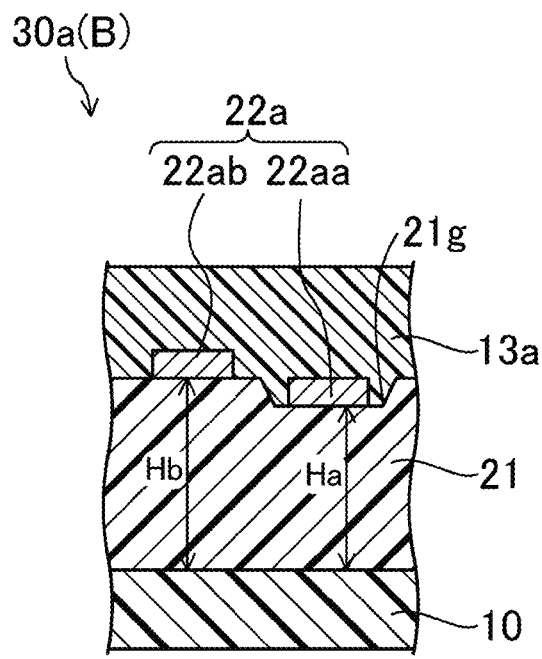
FIG. 8 is a cross-sectional view of a frame region of the organic EL display device taken along the line VIII-VIII in FIG. 5.

FIG. 1 to FIG. 8 illustrate a first embodiment of a display device according to the disclosure. Note that, in each of the following embodiments, an example of an organic EL display device equipped with organic EL elements is given as a display device equipped with light-emitting elements. FIG. 1 is a plan view of an organic EL display device 30a according to the first embodiment. FIG. 2 is a cross-sectional view of a display region D of the organic EL display device 30a taken along line II-II in FIG. 1. FIG. 3 is an equivalent circuit diagram illustrating a TFT layer 29 included in the organic EL display device 30a. FIG. 4 is a cross-sectional view illustrating an organic EL layer 16 included in the organic EL display device 30a. FIG. 5 is a plan view illustrating a frame region of the organic EL display device 30a. FIG. 6, FIG. 7, and FIG. 8 are cross-sectional views of a frame region F of the organic EL display device 30a taken along line VI-VI, line VII-VII, and line VIII-VIII in FIG. 5.

As illustrated in FIG. 1, the organic EL display device 30a includes a display region D defined in a rectangular shape for displaying an image, and the frame region F defined around the display region D. As illustrated in FIG. 2, the display region D of the organic EL display device 30a is provided with organic EL elements 19, and in the display region D, a plurality of pixels are arranged in a matrix pattern. Note that each of the pixels in the display region D includes, for example, a subpixel for display of red grayscale, a subpixel for display of green grayscale, and a subpixel for display of blue grayscale. These subpixels are disposed adjacent to one another. As illustrated in FIG. 1, a terminal section T is provided at the right end portion of the frame region F in the figure. Further, as illustrated in FIG. 1, between the display region D and the terminal section T in the frame region F, a bending section B bendable at 180 degrees (in a U shape) with a bending axis being the vertical direction in the figure is provided to be along one side (right side in the figure) of the display region D.

As illustrated in FIG. 2, the organic EL display device 30a includes, in the display region D, a resin substrate layer 10, a TFT layer 29 provided on the front surface of the resin substrate layer 10, and an organic EL element 19 provided, as a light-emitting element, on the front surface of the TFT layer 29, a front surface side protection layer 25a provided on the front surface of the organic EL element 19, and a back surface side protection layer 25b provided on the back surface of the resin substrate layer 10.

The resin substrate layer 10, which is formed of, for example, a polyimide resin or the like with a thickness of approximately from 10 μm to 20 μm, is provided as a resin substrate.

As illustrated in FIG. 2, the TFT layer 29 includes a base coat film 11a provided on the resin substrate layer 10, a plurality of first TFTs 12ta (see FIG. 3) and a plurality of second TFTs 12tb that are provided on the base coat film 11a, and a TFT flattening film 13a provided on the first TFTs 12ta and the second TFTs 12tb. As illustrated in FIG. 3, the TFT layer 29 is provided with a plurality of gate lines 26 provided to extend in parallel to one another in the horizontal direction in the figure. As illustrated in FIG. 3, the TFT layer 29 is also provided with a plurality of source lines 27a provided to extend in parallel to one another in the vertical direction in the figure. Further, as illustrated in FIG. 3, the TFT layer 29 is further provided with a plurality of power supply lines 27b each provided juxtaposed to each source line 27a to extend in parallel to one another in the vertical direction in the figure. Further, as illustrated in FIG. 3, the TFT layer 29 is further provided with, in each subpixel, the first TFT 12ta, the second TFT 12tb, and a capacitor 28.

The base coat film 11a is formed with, for example, a single layer film or a multilayer film of an inorganic insulating film such as a silicon nitride film, a silicon oxide film, a silicon oxynitride film, or the like.

As illustrated in FIG. 3, the first TFT 12ta is connected to respective gate line 26 and source line 27a in each subpixel. Further, as illustrated in FIG. 3, the second TFT 12tb is connected to respective first TFT 12ta and power supply line 27b in each subpixel. The first TFT 12ta and the second TFT 12tb each include, for example, semiconductor layers provided in an island pattern on the base coat film 11a, a gate insulating film 12a (see FIG. 6) provided to cover the semiconductor layers, a gate electrode provided to partially overlap with the semiconductor layers on the gate insulating film 12a, a first interlayer insulating film 12c and a second interlayer insulating film 12d (see FIG. 6) provided to cover the gate electrode, and a source electrode and a drain electrode provided in a manner spaced apart from each other on the second interlayer insulating film 12d. Note that, although in the first embodiment, the top-gate type is described as an example of the first TFT 12ta and the second TFT 12tb, the first TFT 12ta and the second TFT 12tb may be of the bottom-gate type.

As illustrated in FIG. 3, the capacitor 28 is connected to the respective first TFT 12ta and power supply line 27b in each subpixel. The capacitor 28 is formed with, for example, one electrode formed of the same material in the same layer as the gate electrode, the other electrode formed of the same material in the same layer as the source electrode and the drain electrode, and the first interlayer insulating film 12c and/or the second interlayer insulating film 12d (see FIG. 6) provided between the pair of these electrodes.

The TFT flattening film 13a is formed of, for example, a colorless and transparent organic resin material, such as a polyimide resin.

As illustrated in FIG. 2, the organic EL element 19 includes a plurality of first electrodes 14, an edge cover 15, a plurality of organic EL layers 16, a second electrode 17, and a sealing film 18, which are provided in the order stated, over the TFT flattening film 13a.

As illustrated in FIG. 2, the plurality of first electrodes 14 are provided, each corresponding to each subpixel, in a matrix pattern over the TFT flattening film 13a. As illustrated in FIG. 2, the first electrode 14 is connected to the drain electrode of the second TFT 12tb via a contact hole formed through the TFT flattening film 13a. The first electrode 14 functions to inject holes into the organic EL layer 16. It is further preferable that the first electrodes 14 includes a material having a large work function to improve the hole injection efficiency into the organic EL layer 16. Examples of materials that may be included in the first electrode 14 include metal materials, such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the first electrode 14 include alloys, examples of which include magnesium (Mg)-copper (Cu), magnesium (Mg)-silver (Ag), sodium (Na)-potassium (K), astatine (At)-astatine oxide (AtO$_2$), lithium (Li)-aluminum (Al), lithium (Li)-calcium (Ca)-aluminum (Al), and lithium fluoride (LiF)-calcium (Ca)-aluminum (Al). Further examples of materials that may be included in the first electrode 14 include electrically conductive oxides, examples of which include tin oxide (SnO), zinc oxide (ZnO), indium tin oxide (ITO), and indium zinc oxide (IZO). The first electrode 14 may include a stack of two or more layers of any of the above-mentioned materials. Note that, examples of materials having a large work function include indium tin oxide (ITO) and indium zinc oxide (IZO).

As illustrated in FIG. 2, the edge cover 15 is provided in a lattice pattern and surrounds the outer perimeter portion of each first electrode 14. Examples of materials that may be included in the edge cover 15 include an inorganic film, for example, a silicon oxide ($SiO_2$) film, a silicon nitride (SiNx (x is a positive number)) film such as a trisilicon tetranitride ($Si_3N_4$) film, or a silicon oxynitride (SiON) film; and an organic film, for example, a polyimide resin film, an acrylic resin film, a polysiloxane resin film, or a novolak resin film.

As illustrated in FIG. 2, the plurality of organic EL layers 16 are provided in a matrix pattern, each being arranged on each first electrodes 14 and each corresponding to each subpixel. As illustrated in FIG. 4, the organic EL layers 16 each include a hole injection layer 1, a hole transport layer 2, a light-emitting layer 3, an electron transport layer 4, and an electron injection layer 5, which are provided in the order stated, over the first electrode 14.

The hole injection layer 1 is also referred to as an anode buffer layer, and functions to reduce the energy level difference between the first electrode 14 and the organic EL layer 16, to improve the hole injection efficiency into the organic EL layer 16 from the first electrode 14. Examples of materials that may be included in the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 14 to the organic EL layer 16. Examples of materials that may be included in the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons recombine, when a voltage is applied via the first electrode 14 and the second electrode 17, the holes and electrons are injected from the first electrode 14 and the second electrode 17, respectively. The light-emitting layer 3 is formed of a material having high light-emitting efficiency. Examples of materials that may be included in the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate efficient migration of the electrons to the light-emitting layer 3. Examples of materials that may be included in the electron transport layer 4 include organic compounds, example of which include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 5 functions to reduce the energy level difference between the second electrode 17 and the organic EL layer 16, to improve the efficiency of electron injection into the organic EL layer 16 from the second electrode 17. Because of this function, the driving voltage for the organic EL element 19 can be reduced. Note that the electron injection layer 5 is also referred to as a cathode buffer layer. Examples of materials that may be included in the electron injection layer 5 include inorganic alkaline compound such as lithium fluoride (LiF), magnesium fluoride ($MgF_2$), calcium fluoride ($CaF_2$), strontium fluoride ($SrF_2$), or barium fluoride ($BaF_2$); aluminum oxide ($Al_2O_3$); and strontium oxide (SrO).

As illustrated in FIG. 2, the second electrode 17 is disposed to cover the organic EL layers 16 and the edge cover 15. The second electrode 17 functions to inject electrons into the organic EL layer 16. It is further preferable that the second electrode 17 includes a material having a small work function to improve the efficiency of electron injection into the organic EL layer 16. Examples of materials that may be included in the second electrode 17 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). Further examples of materials that may be included in the second electrode 17 include alloys, examples of which include magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), and lithium fluoride (LiF)-calcium (Ca)-aluminum (Al). Further examples of materials that may be included in the second electrode 17 include electrically conductive oxides, examples of which include tin oxide (SnO), zinc oxide (ZnO), indium tin oxide (ITO), and indium zinc oxide (IZO). The second electrode 17 may include a stack of two or more layers of any of the above-mentioned materials. Note that, examples of materials having a small work function include magnesium (Mg), lithium (Li), lithium fluoride (LiF), magnesium (Mg)-copper (Cu), magnesium (Mg)-silver (Ag), sodium (Na)-potassium (K), lithium (Li)-aluminum (Al), lithium (Li)-calcium (Ca)-aluminum (Al), and lithium fluoride (LiF)-calcium (Ca)-aluminum (Al).

As illustrated in FIG. 2, the sealing film 18 is provided to cover the second electrode 17, and functions to protect the organic EL layer 16 from moisture and oxygen. Examples of materials that may be included in the sealing film 18 include inorganic materials, example of which include silicon oxide ($SiO_2$), aluminum oxide ($Al_2O_3$), silicon nitride (SiNx (x is a positive number)) such as trisilicon tetranitride ($Si_3N_4$), and silicon carbon nitride (SiCN); and organic materials, example of which include acrylate, polyurea, parylene, polyimide, and polyamide.

The front surface side protection layer 25a and the back surface side protection layer 25b are each formed with, for example, a polyimide resin film or the like with a thickness of approximately 2 μm.

As illustrated in FIG. 5, FIG. 6 and FIG. 7, the organic EL display device 30a includes, in the frame region F, the resin substrate layer 10, an inorganic layered film La provided on the front surface of the resin substrate layer 10, and a frame flattening film 21 provided to plug an opening portion A of the inorganic layered film La, a plurality of frame wiring lines 22a provided on the front surfaces of the inorganic layered film La and the frame flattening film 21 to extend in parallel to one another, and the TFT flattening film 13a provided to cover the frame wiring lines 22a.

The inorganic layered film La includes, as illustrated in FIG. 6 and FIG. 7, the base coat film 11a, the gate insulating film 12a, the first interlayer insulating film 12c, and the second interlayer insulating film 12d, which are layered in the order stated, over the resin substrate layer 10. As illustrated in FIG. 6 and FIG. 7, the inorganic layered film La is not provided in the bending section B by having the opening portion A. Further, between the gate insulating film 12a and the first interlayer insulating film 12c in the inorganic layered film La, as illustrated in FIG. 6 and FIG. 7, a first gate conductive layer 12ba and a second gate conductive layer 12bb are provided. The first gate conductive layer 12ba is connected to a signal wiring line (for example, gate line, source line, and power supply line) of the organic EL element 19 in the display region D. The second gate conductive layer 12bb is provided to extend to the terminal section T. Note that the front surface side protection layer 25a and the back surface side protection layer 25b that are arranged in the display region D are also provided in the most part of the frame region F, but are not provided at the bending section B of the frame region F.

The frame flattening film 21a is formed with, for example, an organic insulating film such as a polyimide resin film with a thickness of approximately 2 μm.

As illustrated in FIG. 5 to FIG. 8, a frame wiring line 22a is provided, at the bending section B, being interposed between the frame flattening film 21 and the TFT flattening film 13a, and includes a first branch wiring line 22aa and a second branch wiring line 22ab being divided into two branches. As illustrated in FIG. 5 to FIG. 7, both end portions of the frame wiring line 22a are each connected to the first gate conductive layer 12ba and the second gate conductive layer 12bb via contact holes Ca and Cb formed through the first interlayer insulating film 12c and the second interlayer insulating film 12d. The frame wiring line 22a is formed with, for example, a metal layered film of a titanium film (with a thickness of approximately 200 nm)/an aluminum film (with a thickness of approximately 100 nm)/a titanium film (with a thickness of approximately 200 nm). Note that, although in the first embodiment, the example of the frame wiring line 22a formed with a metal layered film is given, the frame wiring line 22a may also be formed with a metal single layer film. Also note that, although in the first embodiment, the example of the frame wiring line 22a including the first branch wiring line 22aa and the second branch wiring line 22ab being divided into two branches is given, the frame wiring line 22a may be divided into three or more branches. Also note that, although in the first embodiment, the example of the frame wiring line 22a connected to the first gate conductive layer 12ba and the second gate conductive layer 12bb is given, the frame wiring line 22a may be connected to a conductive layer of another layer.

As illustrated in FIG. 5, FIG. 6 and FIG. 8, the first branch wiring line 22aa is provided to pass the interior of a groove 21g formed on the front surface of the frame flattening film 21. Further, as illustrated in FIG. 5, FIG. 7 and FIG. 8, the second branch wiring line 22ab is provided exterior to the groove 21g formed on the front surface of the frame flattening film 21. Accordingly, as illustrated in FIG. 8, the first branch wiring line 22aa is provided at a height Ha (for example, approximately from 0.25 μm to 1.5 μm) from the front surface of the resin substrate layer 10, while the second branch wiring line 22ab is provided at a height Hb (for example, approximately from 0.5 μm to 3.0 μm) from the front surface of the substrate layer 10.

The organic EL display device 30a described above has flexibility, and is configured, in each subpixel, such that the light-emitting layer 3 of the organic EL layer 16 is caused to appropriately emit light via the first TFT 12ta and the second TFT 12tb so that images are displayed.

The organic EL display device 30a of the first embodiment can be manufactured as described below.

For example, the organic EL display device 30a can be manufactured in such a way that a base coat film 11a and an organic EL element 19 are formed, using a well-known method, on the front surface of a resin substrate layer 10 formed on a glass substrate, a front surface side protection layer 25a is applied to the organic EL element 19 via an adhesive layer, and then a back surface side protection layer 25b is applied to the back surface of the resin substrate layer 10, from which the glass substrate has been peeled off, via an adhesive layer. The frame wiring line 22 of the frame region F is formed when the source electrode and the drain electrode of the first TFT 12ta (the second TFT 12tb) that are included in the organic EL element 19 are formed. The frame flattening film 21 in the frame region F is formed, before the formation of the source electrode and the drain electrode of the first TFT 12ta (the second TFT 12tb) that are included in the organic EL element 19, by forming and patterning using a halftone mask, a graytone mask, or the like, a photosensitive organic insulating film such as a polyimide resin film in the frame region F alone.

As described above, according to the organic EL display device 30a of the first embodiment, the frame wiring line 22a includes, at the bending section B, the first branch wiring line 22aa and the second branch wiring line 22ab being divided into two branches, where the first branch wiring line 22aa and the second branch wiring line 22ab are arranged at different heights Ha and Hb relative to the resin substrate layer 10. This allows the stresses applied to the first branch wiring line 22aa and the second branch wiring line 22ab to differ from each other when the bending section B is caused to be bent. This makes it possible to prevent the first branch wiring line 22aa and the second branch wiring line 22ab from being uniformly broken when the bending section B is caused to be bent, thus make it possible to prevent, at the bending section B of the frame region F, breakages of the first branch wiring line 22aa and the second branch wiring line 22ab that are branched.

Second Embodiment

Figure 9:
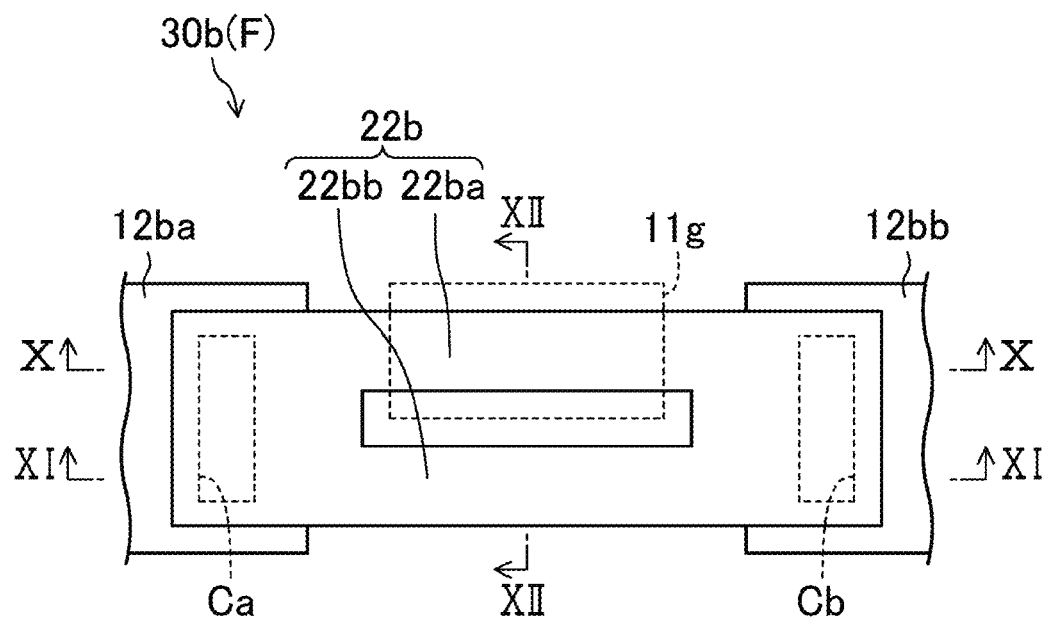
FIG. 9 is a plan view illustrating a frame region of an organic EL display device according to a second embodiment of the disclosure.
Figure 10:
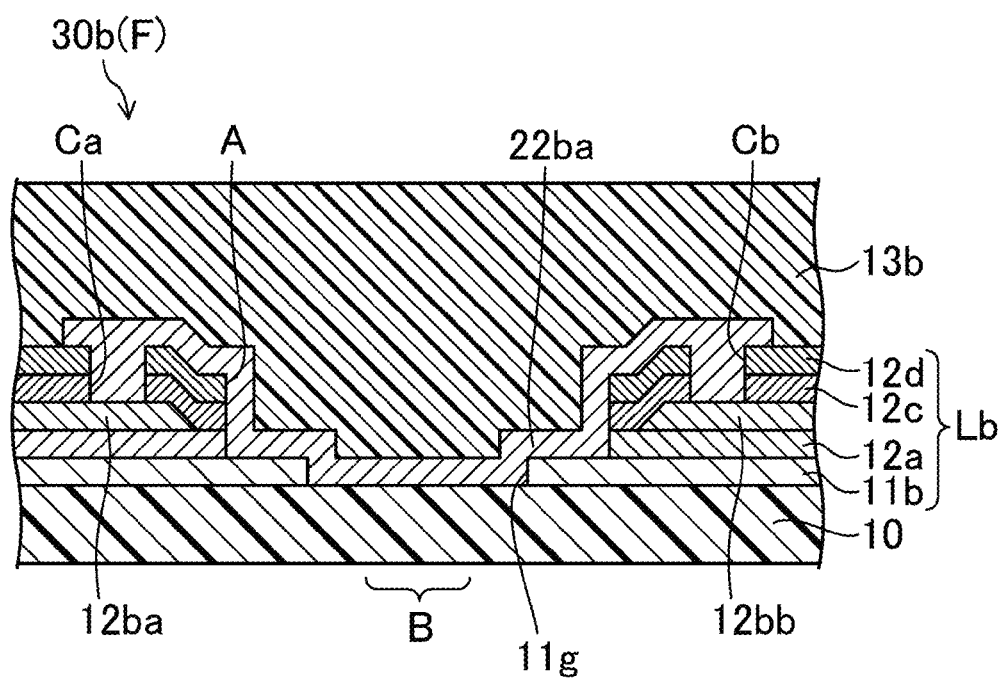
FIG. 10 is a cross-sectional view of a frame region of the organic EL display device taken along the line X-X in FIG. 9.
Figure 11:
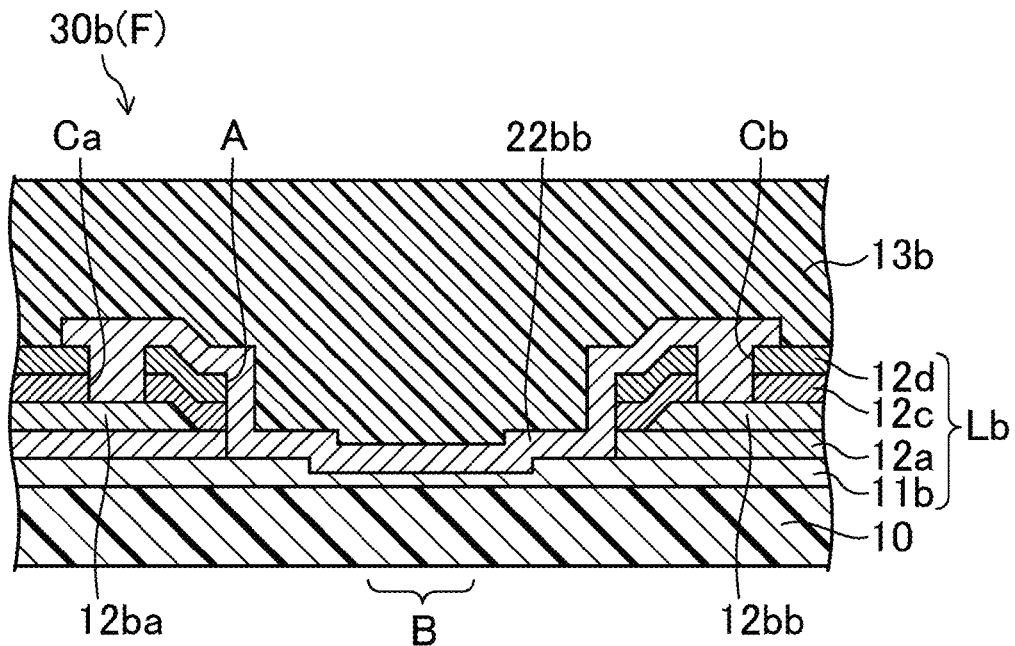
FIG. 11 is a cross-sectional view of a frame region of the organic EL display device taken along the line XI-XI in FIG. 9.
Figure 12:
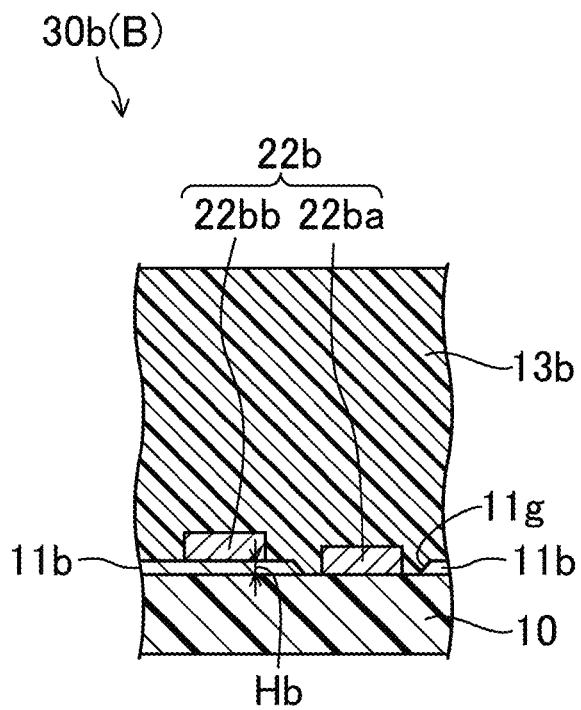
FIG. 12 is a cross-sectional view of a frame region of the organic EL display device taken along line XII-XII in FIG. 9.
Figure 13:
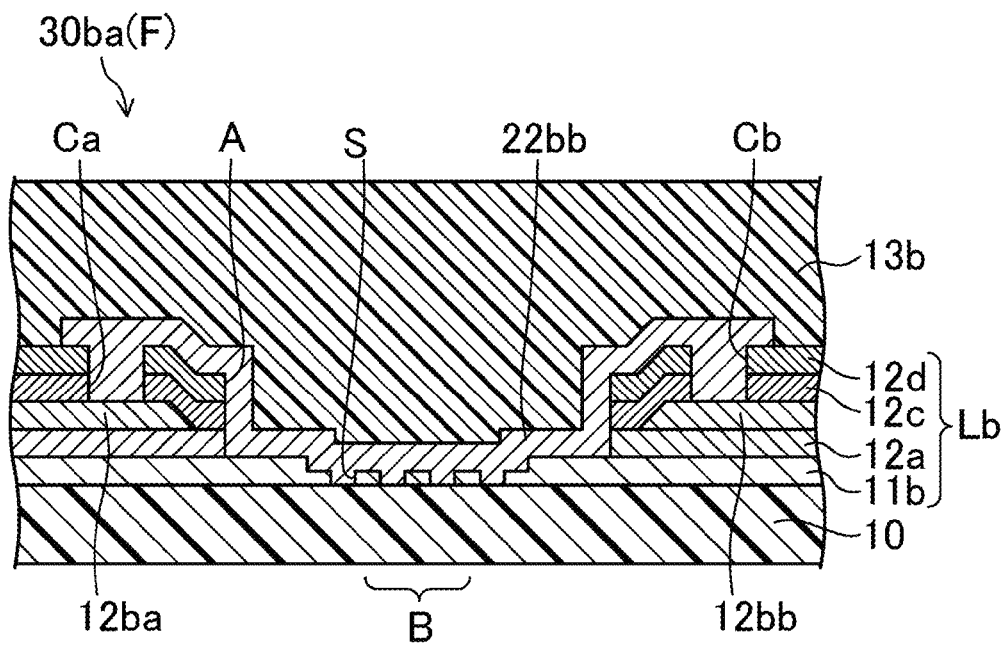
FIG. 13 is a cross-sectional view illustrating a frame region of a modified example of the organic EL display device according to the second embodiment of the disclosure, where

FIG. 9 to FIG. 13 illustrate a second embodiment of the display device according to the disclosure. FIG. 9 is a plan view illustrating a frame region F of an organic EL display device 30b according to the second embodiment. FIG. 10, FIG. 11, and FIG. 12 are cross-sectional views of the frame region F of the organic EL display device 30b taken along line X-X, line XI-XI, and line XII-XII in FIG. 9. FIG. 13 is a cross-sectional view illustrating a frame region F of an organic EL display device 30ba being a modified example of the organic EL display device 30b, where FIG. 13 is a view corresponding to FIG. 11. Note that, in the following embodiments, portions identical to those in FIG. 1 to FIG. 8 are denoted by the same reference signs, and their detailed descriptions are omitted.

In the first embodiment, the example of the organic EL display device 30a in which a step portion is formed between the first branch wiring line 22aa and the second branch wiring line 22ab by means of the groove 21g of the frame flattening film 21 is given. However, in the second embodiment, an example of the organic EL display device 30b in which a step portion is formed between a first branch wiring line 22ba and a second branch wiring line 22bb by means of a groove 11g of a base coat film 11b is given.

The organic EL display device 30b, like the organic EL display device 30a of the first embodiment, includes a display region D for displaying an image, defined in a rectangular shape, and the frame region F defined around the display region D.

The display region D of the organic EL display device 30b has the same configuration as in the organic EL display device 30a of the first embodiment.

As illustrated in FIG. 9, FIG. 10, and FIG. 11, the organic EL display device 30a includes, in the frame region F, the resin substrate layer 10, an inorganic layered film Lb provided on the front surface of the resin substrate layer 10, frame wiring lines 22b provided on the front surface of the inorganic layered film Lb to extend in parallel to one another, and a TFT flattening film 13b provided to cover the frame wiring lines 22b.

As illustrated in FIG. 10 and FIG. 11, the inorganic layered film Lb includes the base coat film 11b, a gate insulating film 12a, a first interlayer insulating film 12c, and a second interlayer insulating film 12d, which are layered in the order stated, over the resin substrate layer 10. Further, as illustrated in FIG. 10 and FIG. 11, the gate insulating film 12a, the first interlayer insulating film 12c, and the second interlayer insulating film 12d in the inorganic layered film Lb are not provided in the bending section B by having an opening portion A. Further, as illustrated in FIG. 10 and FIG. 11, between the gate insulating film 12a and the first interlayer insulating film 12c in the inorganic layered film Lb, a first gate conductive layer 12ba and a second gate conductive layer 12bb are provided. Note that the front surface side protection layer 25a and the back surface side protection layer 25b that are arranged in the display region D are also provided in the most part of the frame region F, but are not provided at the bending section B of the frame region F.

As illustrated in FIG. 9 to FIG. 12, the frame wiring line 22b is provided, at the bending section B, being interposed between the base coat film 11b and the TFT flattening film 13b, and includes a first branch wiring line 22ba and a second branch wiring line 22bb being divided into two branches. As illustrated in FIG. 9 to FIG. 11, both end portions of the frame wiring line 22b are each connected to the first gate conductive layer 12ba and the second gate conductive layer 12bb via contact holes Ca and Cb formed through the first interlayer insulating film 12c and the second interlayer insulating film 12d. The frame wiring line 22b is formed with, for example, a metal layered film of a titanium film (with a thickness of approximately 200 nm)/an aluminum film (with a thickness of approximately 100 nm)/a titanium film (with a thickness of approximately 200 nm). Note that, although in the second embodiment, the example of the frame wiring line 22a formed with a metal layered film is given, the frame wiring line 22b may also be formed with a metal single layer film. Also note that, although in the second embodiment, the example of the frame wiring line 22b including the first branch wiring line 22ba and the second branch wiring line 22bb being divided into two branches is given, the frame wiring line 22b may be divided into three or more branches.

As illustrated in FIG. 9, FIG. 10 and FIG. 12, the first branch wiring line 22ba is provided to pass the interior of the groove 11g formed on the front surface of the base coat film 11b. As illustrated in FIG. 10 and FIG. 12, the groove 11g is provided to pass through the base coat film 11b. As illustrated in FIG. 9, FIG. 11, and FIG. 12, the second branch wiring line 22bb is provided exterior to the groove 11g formed on the front surface of the base coat film 11b. Accordingly, as illustrated in FIG. 12, the first branch wiring line 22ba is provided on the front surface of the resin substrate layer 10, while the second branch wiring line 22bb is provided at a height Hb (for example, approximately from 0.1 μm to 0.5 μm) from the front surface of the resin substrate layer 10. As illustrated in FIG. 11, the base coat film 11b is formed thinner at the bending section B where the second branch wiring line 22bb is disposed than the portion at the display region D, thus making it possible to prevent breakage of the second branch wiring line 22bb. Note that, as in the case of the organic EL display device 30ba being the modified example illustrated in FIG. 13, the portion formed thin in the base coat film 11b at the bending section B may be divided to form a plurality of slits S to suppress the occurrence of cracks.

The organic EL display device 30b described above has flexibility like the organic EL display device 30a of the first embodiment, and is configured, in each subpixel, such that the light-emitting layer 3 of the organic EL layer 16 is caused to appropriately emit light via the first TFT 12ta and the second TFT 12tb so that images are displayed.

The organic EL display device 30b of the second embodiment can be manufactured, by modifying the pattern shapes of the base coat film 11a using a halftone mask, a graytone mask, or the like, in the method for manufacturing the organic EL display device 30a of the first embodiment.

As described above, according to the organic EL display device 30b of the second embodiment, the frame wiring line 22b includes, at the bending section B, the first branch wiring line 22ba and the second branch wiring line 22bb being divided into two branches, where the first branch wiring line 22ba and the second branch wiring line 22bb are arranged at different heights relative to the resin substrate layer 10. This allows the stresses applied to the first branch wiring line 22ba and the second branch wiring line 22bb to differ from each other when the bending section B is caused to be bent. This makes it possible to prevent the first branch wiring line 22ba and the second branch wiring line 22bb from being uniformly broken when the bending section B is caused to be bent, thus make it possible to prevent, at the bending section B of the frame region F, breakage of the first branch wiring line 22ba and the second branch wiring line 22bb that are branched.

Other Embodiments

Figure 14:
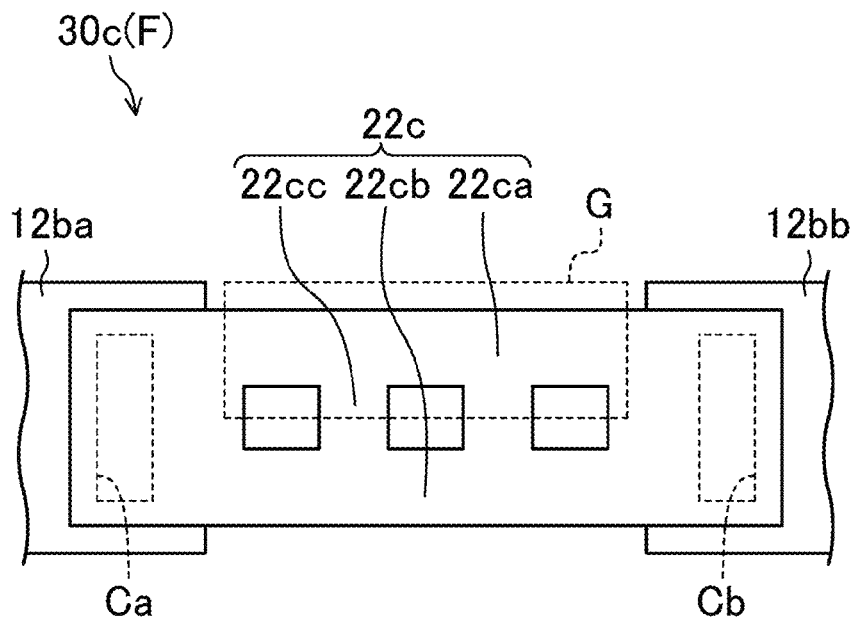
FIG. 14 is a plan view illustrating a frame region of an organic EL display device according to another embodiment of the disclosure.
Figure 15:
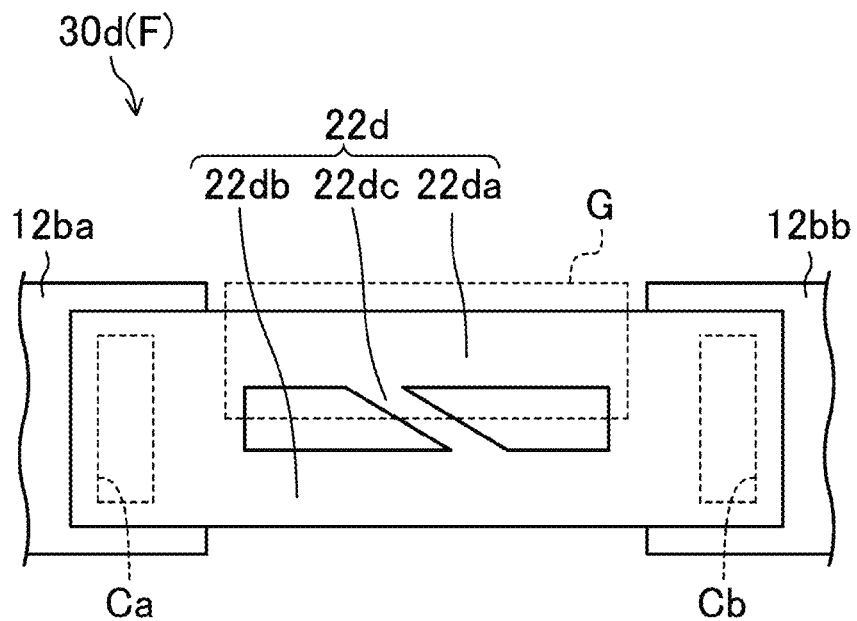
FIG. 15 is a plan view illustrating a frame region of a first modified example of the organic EL display device according to another embodiment of the disclosure.
Figure 16:
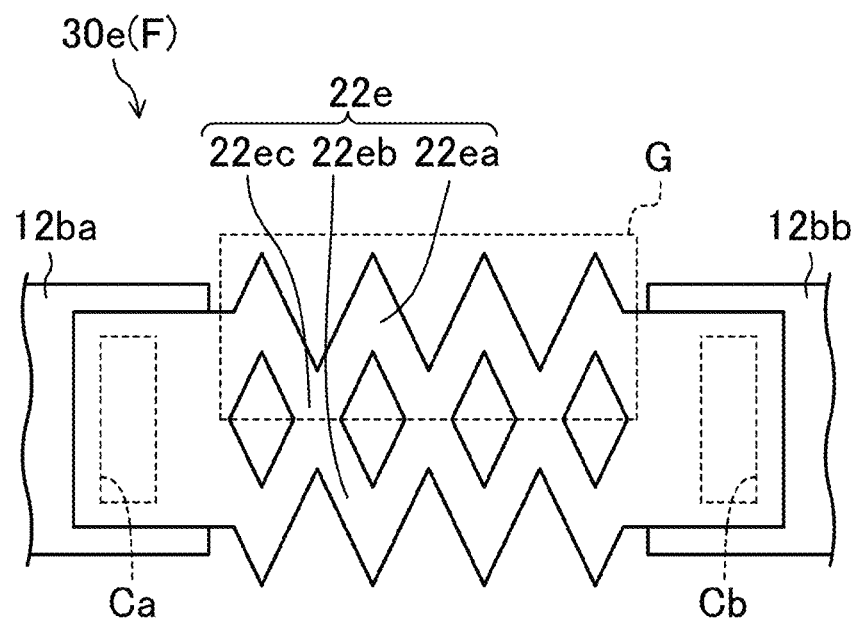
FIG. 16 is a plan view illustrating a frame region in a second modified example of the organic EL display device according to another embodiment of the disclosure.

Although in the above-described first and second embodiments, the examples of the frame wiring lines 22a and 22b, in the organic EL display devices 30a and 30b, in each of which a pair of branch wiring lines are connected to each other at both end portions are given, the frame wiring lines may be frame wiring lines 22c to 22e as illustrated in FIG. 14 to FIG. 16. FIG. 14 to FIG. 16 are plan views illustrating frame regions F of organic EL display devices 30c to 30e according to the other embodiments.

More specifically, as illustrated in FIG. 14, in the organic EL display device 30c, a first branch wiring line 22ca and a second branch wiring line 22cb that are included in the frame wiring line 22c are connected to each other via connection sections 22cc formed at two locations in the middle portions. Here, a step portion is formed by means of a groove G formed on the front surface of the base coat film, the frame flattening film, or the like, between the first branch wiring line 22ca and the second branch wiring line 22cb. The connection section 22cc is provided to override a step portion G due to the two types of heights.

In the organic EL display device 30d, as illustrated in FIG. 15, a first branch wiring line 22da and a second branch wiring line 22db that are included in a frame wiring line 22d are connected to each other via a connection section 22dc being obliquely extended and being formed at the middle portions. Between the first branch wiring line 22da and the second branch wiring line 22db, a step portion is formed by means of a groove G formed on the front surface of the base coat film, the frame flattening film, or the like. The connection section 22dc is provided to override the step portion G due to the two types of heights.

As illustrated in FIG. 16, in the organic EL display device 30e, a first branch wiring line 22ea and a second branch wiring line 22eb that are included in the frame wiring line 22e are connected via connection sections 22ec formed at a plurality of locations in the middle portions. Here, as illustrated in FIG. 16, the frame wiring line 22e is provided in a chain form in a plan view. Between the first branch wiring line 22ea and the second branch wiring line 22eb, a step portion is formed by means of a groove G formed on the front surface of a base coat film, a frame flattening film, or the like. The connection section 22ec is provided to override the step portion G due to the two types of heights.

Note that, although in the above-described embodiments, the example of the organic EL display device as a display device is given, the disclosure is applicable to a display device equipped with a plurality of light-emitting elements which are driven with current, for example, a display device equipped with quantum dot light-emitting diodes (QLEDs), which are light-emitting elements using quantum dot-containing layer.

Also note that, in the above-described embodiments, the example of the organic EL layer of the five-layer structure including the hole injection layer, the hole transport layer, the light-emitting layer, the electron transport layer, and the electron injection layer is given. It is also possible that, for example, the organic EL layer may include a three-layer structure including a hole injection-cum-transport layer, a light-emitting layer, and an electron transport-cum-injection layer.

Also note that, in the above-described embodiments, the example of the organic EL display device including the first electrode as an anode and the second electrode as a cathode is given. However, the disclosure is also applicable to an organic EL display device, in which the layers of the structure of the organic EL layer are in the reverse order, with the first electrode being a cathode and the second electrode being an anode.

Also note that, in the above-described embodiments, the example of the organic EL display device in which the electrode of the TFT connected to the first electrode serves as the drain electrode is given. However, the disclosure is also applicable to an organic EL display device in which the electrode of the TFT connected to the first electrode is referred to as the source electrode.

INDUSTRIAL APPLICABILITY

As described above, the disclosure is useful for flexible display devices.

REFERENCE SIGNS LIST

A Opening portion (of inorganic insulating film)
B Bending section
D Display region
F Frame region
G Groove
T Terminal section
10 Resin substrate layer (resin substrate)
11b Base coat film (inorganic insulating film)
11g Opening portion (of base coat film)
12a Gate insulating film (inorganic insulating film)
12c First interlayer insulating film (inorganic insulating film)
12d Second interlayer insulating film (inorganic insulating film)
13a, 13b TFT flattening film
19 Organic EL element (light-emitting element)
21 Frame flattening film
21g Groove
22a to 22e Frame wiring line
22aa, 22ba, 22ca, 22da, 22ea First branch wiring line
22ab, 22bb, 22cb, 22db, 22eb Second branch wiring line
22cc, 22dc, 22c Connection section
29 TFT layer
30a to 30e Organic EL display device

The invention claimed is:

1. A display device comprising:
a resin substrate;
a light-emitting element within a display region provided on the resin substrate;
a frame region provided around the display region on the resin substrate;
a terminal section provided at an end portion of the frame region;
a conductive layer connected to the light-emitting element, the conductive layer extending from the display region into the frame region; and
a frame wiring line provided in the frame region, the frame wiring line extending to the terminal section and being connected to the conductive layer, wherein
the frame region includes a bending section provided between the display region and the terminal section,
the frame wiring line includes a plurality of branch wiring lines extending through the bending section,
between the resin substrate and the light-emitting element, a TFT layer including a plurality of inorganic insulating films and a TFT flattening film is provided,
at the bending section, an opening portion is defined in at least one of the plurality of inorganic insulating films, and a frame flattening film is provided on the resin substrate and fills the opening portion,
the frame wiring line is provided, at the bending section, being interposed between the frame flattening film and the TFT flattening film,
on a surface of the frame flattening film, a groove is defined, the groove being spaced apart from both the conductive layer and the terminal section, the plurality of branch wiring lines includes a first branch wiring line and a second branch wiring line that are a pair of branch wiring lines provided on the frame flattening film, the first branch wiring line includes a first wiring portion, a second wiring portion, and a third wiring portion, the first wiring portion is provided inside the groove and extends across the groove, the second wiring portion is provided outside the groove and extends from one end of the first wiring portion to the conductive layer, the third wiring portion is provided outside the groove and extends from the other end of the first wiring portion to the terminal section, the second branch wiring line is provided outside the groove and extends between the conductive layer and the terminal section, and the first wiring portion and the second branch wiring line are arranged at different heights relative to the resin substrate.

2. The display device according to claim 1, wherein the light-emitting element includes an organic EL element.

3. The display device according to claim 1, wherein the resin substrate, the frame flattening film, and the TFT flattening film are each made of a polyimide resin.

4. The display device according to claim 1, wherein the second wiring portion, the third wiring portion, and the second branch wiring line are arranged at a same height relative to the resin substrate.

5. The display device according to claim 1, wherein
each of the first branch wiring line and the second branch wiring line extends between the conductive layer and the terminal section in a straight line when viewed in a direction perpendicular to a surface of the resin substrate, and the frame flattening film is provided on the surface of the resin substrate.

* * * * *